US006825054B2

(12) United States Patent
Valentine et al.

(10) Patent No.: US 6,825,054 B2
(45) Date of Patent: Nov. 30, 2004

(54) LIGHT EMITTING CERAMIC DEVICE AND METHOD FOR FABRICATING THE SAME

(76) Inventors: Paul Valentine, 6170 Gypsy Hill Rd., Hornell, NY (US) 14843; Doreen D. Edwards, 24 Cummings Pl., Wellsville, NY (US) 14895; William John Walker, Jr., 56 W. University St., Alfred, NY (US) 14802; Lyle H. Slack, 3464 Sunset Dr., Wellsville, NY (US) 14895; Wayne Douglas Brown, Rte. 68, Box 154, Williamsburg, WV (US) 24991; Cathy Osborne, HC 71, Box 145A, Kieffer, WV (US) 24950; Michael Norton, 122 Wood Lomond Way, Huntington, WV (US) 25705; Richard Begley, 2673 1st Ave., Huntington, WV (US) 25702

( * ) Notice: Subject to any disclaimer, the term of this patent is extended or adjusted under 35 U.S.C. 154(b) by 0 days.

(21) Appl. No.: 10/301,341

(22) Filed: Nov. 21, 2002

(65) Prior Publication Data

US 2003/0094896 A1 May 22, 2003

Related U.S. Application Data

(60) Provisional application No. 60/332,089, filed on Nov. 21, 2001.

(51) Int. Cl.$^{7}$ .................. H01L 21/00

(52) U.S. Cl. .................. 438/22

(58) Field of Search .................. 438/22, 99; 428/690; 313/498–506; 427/66

(56) References Cited

U.S. PATENT DOCUMENTS

| | | | | |
|---|---|---|---|---|
| 3,048,732 A | | 8/1962 | Lehmann et al. | |
| 3,073,982 A | | 1/1963 | Buck et al. | |
| 3,103,607 A | | 9/1963 | Rulon et al. | |
| 3,127,534 A | | 3/1964 | Diemer | |
| 3,200,279 A | | 8/1965 | Westerveld et al. | |
| 3,201,632 A | | 8/1965 | Westerveld et al. | |
| 3,205,393 A | | 9/1965 | Mash | |
| 3,275,870 A | | 9/1966 | Buck et al. | |
| 3,283,194 A | | 11/1966 | Rulon | |
| 4,482,580 A | | 11/1984 | Emmett et al. | |
| 5,530,318 A | | 6/1996 | Ensign et al. | |
| 5,560,957 A | * | 10/1996 | Johnson | 427/66 |
| 5,856,029 A | * | 1/1999 | Burrows | 428/690 |
| 6,091,192 A | | 7/2000 | Winsor | |
| 6,583,584 B2 | * | 6/2003 | Duineveld et al. | 315/169.3 |
| 6,589,674 B2 | * | 7/2003 | Li et al. | 428/690 |
| 6,703,780 B2 | * | 3/2004 | Shiang et al. | 313/504 |
| 2002/0094451 A1 | * | 7/2002 | Li et al. | 428/690 |
| 2003/0224221 A1 | * | 12/2003 | Cheong et al. | 428/704 |

* cited by examiner

*Primary Examiner*—Savitri Mulpuri
(74) *Attorney, Agent, or Firm*—Waters Law Office; Robert R. Waters

(57) ABSTRACT

A light-emitting ceramic based panel, hereafter termed "electroceramescent" panel, and alternative methods of fabrication for the same are claimed. The electroceramescent panel is formed on a substrate providing mechanical support as well as serving as the base electrode for the device. One or more semiconductive ceramic layers directly overlay the substrate, and electrical conductivity and ionic diffusion are controlled. Light emitting regions overlay the semiconductive ceramic layers, and said regions consist sequentially of a layer of a ceramic insulation layer and an electroluminescent layer, comprised of doped phosphors or the equivalent. One or more conductive top electrode layers having optically transmissive areas overlay the light emitting regions, and a multi-layered top barrier cover comprising one or more optically transmissive non-combustible insulation layers overlay said top electrode regions.

50 Claims, 6 Drawing Sheets

LIGHT EMITTING CERAMIC DEVICE AND METHOD FOR FABRICATING THE SAME

CROSS REFERENCE TO RELATED APPLICATIONS

This application claims priority from U.S. provisional application 60/332,089, filed on Nov. 21, 2001. This application relates to methods for fabricating light emitting ceramic devices as well as the devices fabricated pursuant to these methods. The entire disclosure contained in U.S. provisional application 60/332,089, including the attachments thereto is incorporated herein by reference.

STATEMENT REGARDING FEDERALLY SPONSORED RESEARCH OR DEVELOPMENT

The United States government has a paid-up license in this invention and the right in limited circumstances to require the patent owner to license others on reasonable terms as provided for by the terms of contract DE-FC26-99FT40631 awarded by the U.S. Department of Energy.

REFERENCE TO A MICROFICHE APPENDIX:

Not Applicable

BACKGROUND OF THE INVENTION

1. Field of the Invention

This invention relates generally to configurations and fabrication methodologies for light-emitting devices which are comprised of multiple ceramic layers constructed on a supporting substrate and which use electroluminescent phosphors as a light source.

2. Description of Related Art

The fabrication and commercial application of electroluminescent lamps (EL) is a well established art spanning more than five (5) decades. Typically, EL devices use doped zinc sulfide phosphors dispersed in a dielectric material and placed between conductive electrode surfaces. The application of a suitable AC voltage creates an electric field in the dielectric material exciting the phosphors into luminescence. A transparent electrode is used adjacent to the phosphor material permitting the generated light to escape, forming a lamp.

The prior art includes multiple examples of both plastic and ceramic configurations. Ceramic devices received intense development attention over approximately a 10 year period from 1960 to 1970. However, due to the complexity of the ceramic EL devices, there was little success in developing a viable configuration and production process that was competitive. Virtually all successful commercial applications over the intervening several decades have been based on plastic materials and associated processing systems.

U.S. Pat. No. 4,482,580 by Emmett et al attempted to develop and commercialize a variant of device concepts first defined by Buck in U.S. Pat. No. 3,073,982 and Westerveld in U.S. Pat. Nos. 3,201,632 and 3,200,279. The manufacturing yields of the Emmett design proved too low, and the power dissipation levels too high, to successfully compete with plastic EL devices. The Emmett design has other significant performance difficulties as will become evident in comparison with this invention.

Most recently, Winsor (U.S. Pat. No. 6,091,192) sought to improve the Emmett design by adding two (2) new layers (an insulation layer plus a base electrode layer) with the expectation of reduced dissipation levels and improved manufacturing control. The Winsor approach is a variant of device concepts first defined by Diemer (U.S. Pat. No. 3,275,870) and Rulon (U.S. Pat. No. 3,103,607). Although some performance improvement relative to Emmett would be expected, the production costs would be significantly increased due to the additional layers. Further, Winsor fails to address other performance difficulties as will become evident in comparison with this invention.

In short, the substantive prior art related to this invention dates largely to the 1960s. This body of work, now in the public domain, is for the most part conceptual, with validation limited to small area devices and few specific performance requirements. In fact, this prior art (and subsequent noted improvements to the same) have mostly served to confirm that useful devices are possible but have failed to define integrated material systems and processes which could realize this potential in a commercially viable product. There are significant omissions in the set of required device attributes considered, and inadequate attention to the complex interactions between the material compositions in the various device layers. The special challenges of large area devices (e.g. >1 sq-ft) both in terms of production cost and performance were not considered in the prior art.

It is the object of this invention to describe and demonstrate an integrated set of materials and processes which achieve a dramatic improvement in both ceramic EL performance and cost relative to the prior art. This new fabrication methodology and associated materials system are applicable to large areas and enables devices which are superior to plastic EL in many important applications, including those with severe environmental exposure requirements.

A conceptual layout for a typical prior-art ceramic EL device is illustrated in FIG. 1. A metal substrate 1 provides structural support while also serving as a base electrode. An insulating layer 3 is constructed on the substrate providing break-down isolation for an overlying ceramic matrix encasing the EL phosphor 5. A transparent top electrode 7 completes the electrical circuit permitting an intense AC field to be established across the ceramic stack. A transparent ceramic cover layer 9 is used to protect the top electrode 7 and the phosphor layer 5 from the ambient environment. Given a nominal 10:1 ratio between the dielectric constant of the insulation layer relative to the phosphor layer, most of the applied voltage will appear across the ceramic matrix containing the phosphor. Yet in the event of short-circuit through the phosphor layer, the insulating layer will limit the current and help minimize degradation in device performance. This model is deceptively simplistic because the ceramic stack is a blended mechanical, chemical, electrical, and optical system formed through a sequence of molten states, each with a unique time-temperature profile providing the opportunity for diffusion of various constituents between layers and contributing complex residual mechanical stresses upon cool-down to ambient temperature.

In terms of design priorities, a fundamental requirement is that the stack must bond together mechanically with minimal distortions and fracturing due to residual stresses arising from mismatched coefficients of thermal expansion which are compounded by temperature gradients during processing. The cool-down time-temperature profile is often as important as the peak temperatures reached. The metal-to-ceramic bond lines at the substrate are particularly troublesome because the coefficients of thermal expansion cannot be exactly matched and the constituents in the ceramic mix which contribute to a strong bond (generally metal oxides)

have an adverse effect on the electrical properties of the insulation (dielectric) layer. Further, given device areas of several square feet and the inevitable temperature gradients induced by the high temperature oven system, there will be micro-cracking penetrating multiple levels. In practical terms, the device design must accommodate a significant level of statistically certain imperfection while minimizing the adverse performance effects. Therefore optimum device performance is not a simple summation of optimum components. The complexity of the ceramic EL system, and the difficulty in achieving viable commercialization in prior art devices, arises in no small part from these non-linear interactions, especially including a tolerance for some number of localized faults in large area devices.

An exemplary prior art method, as taught by Buck, et al. (U.S. Pat. Nos. 3,073,982 and 3,275,870) is illustrated in FIG. 2. Buck uses low carbon enameling steel as the substrate 11 providing a reasonable thermal expansion coefficient match with an overlying ceramic layer. The mechanical bond to the substrate is achieved through an overlying semiconductive ceramic layer 12 formed by a materials mix containing titanium oxide which becomes semiconducting upon diffusion of iron from the steel substrate. The conductivity of this semiconducting ceramic is sufficiently high as to substantially reduce the power dissipation in this layer. The dielectric layer 13 is formed as a matrix of finely ground barium titanate combined with a glass which also contains titanium oxide. This layer serves to slow the diffusion of iron toward the vulnerable phosphor layer while providing improved break-down protection. The EL phosphor is encased in a glass matrix 14 with an overlying transparent conductive top electrode 15. A protective top cover is provided by bonding an organic adhesive layer 16 and a top electrode 15 wherein the rolled glass provides an improved environmental durability in comparison with enameling processes using glass frits. Buck reports an overall performance level of 7 mw/sq-in of power dissipation at 120 volts, 60 Hz, with an illumination output of 1.2 to 1.5 ft-lamberts. In comparison, the invention disclosed herein achieves this illumination level with a power dissipation of less than 2 mw/sq-in, which is more than a 3:1 improvement.

The materials system taught by Buck does not provide an adequate match in thermal expansion coefficients between the substrate and the semiconducting layer. Hence in large area planar devices (e.g. panels >1 sq-ft), the panels will distort during processing, increasing the magnitude of thermal gradients induced by the oven system and contributing to micro-cracking in the various ceramic layers. Further, the mechanical adhesion between the semiconducting layer and the substrate is significantly weakened by the detailed chemistry of the interaction of the iron oxide interface (which largely provides the bond) with the substantial titanium oxide constituent in the overlying ceramic.

The substrate configuration taught by Emmett suffers from the same limitations. In fact, the residual stresses noted in commercialization attempts based on the Emmett design were such that a post-processing mechanical stress relief step involving bombardment of the substrate rear surface with small metal spheres (in a fashion similar to sandblasting) was required to regain a flat surface.

The rear surface of a low carbon steel substrate is also a major processing contaminate as a result of flaking due to oxidation at the high temperatures required for the ceramic melding. This invention achieves a substantially improved match in thermal expansion coefficients, a substantially improved level of mechanical adhesion, and a total elimination of the flaking debris problem.

The dielectric layer taught by Buck is intended to provide a barrier for further diffusion of iron beyond the semiconducting layer. The barium titanate is relatively immune because the processing temperatures are well below its melting point. However, the glass constituent of the dielectric layer will support iron diffusion introducing possible contamination of the zinc sulfide phosphor layer which is particularly sensitive to iron. The use of titanium oxide in this glass, which potentially increases the dielectric constant, to trap the iron also results in semiconducting behavior and a degraded dissipation factor for the dielectric layer. Iron diffusion effects are the most likely reason for the inferior dissipation levels realized in the Buck design. This invention uses a different doping agent for the semiconducting layer and a different barrier strategy to limit diffusion into and beyond the dielectric layer, leading to superior overall dissipation levels for the device.

The rolled glass protective layer 17 taught by Buck exhibits desirable durability properties. However, the organic bond material 16 is combustible and in direct contact with the top electrode 15. In the event of localized voltage break-downs in the device, the peak temperatures are typically sufficient to carbonize the organic coating creating a permanent, highly visible damaged area. In general, all of the prior art configurations including Buck are vulnerable to voltage break-down effects resulting from micro-cracking which penetrates multiple levels in the ceramic stack. As previously noted, panels of any significant area will almost inevitably exhibit micro-cracks, layer thickness variations, and other defects sufficient to create minor electrical break-downs. The manufacturing yield would be reduced to unacceptable levels if all panels initially exhibiting electrical breakdown were rejected.

U.S. Pat. No. 3,048,732 by Lehmann discloses use of a "poor insulating" layer composed of an asbestos-Portland cement pressboard to limit the current associated with a voltage breakdown and hence reduce the damage potential. None of the prior art provides a means to electrically isolate the fault areas without substantial residual damage to device performance. For example, U.S. Pat. No. 5,530,318 to Ensign includes a fuse integrated with the top electrode distribution bus which would disconnect major portions of the device. This invention provides current limiting in the semiconducting layer, a "fuse coating" as the top electrode, and a ceramic layer overlying the electrode, all of which combine to isolate localized voltage break-downs without significant residual damage to device appearance or performance.

U.S. Pat. Nos. 3,200,279 and 3,201,632 by Westerveld, et al. utilize stainless steel (termed chrome-iron steel by Westerveld) as a substrate in a classic device as previously illustrated in FIG. 1. This substrate choice offers a definite improvement in terms of matched coefficients of thermal expansion but the disclosed dielectric configuration and composition assure poor electrical performance with high levels of power dissipation due to the diffusion of metal ions into the dielectric layer creating semiconducting behavior. Contamination of the phosphor layer is also probable. U.S. Pat. No. 4,482,580 by Emmett features a similar problem, with diffusion into the dielectric layer even though Emmett uses a low carbon steel substrate.

A number of prior art patents disclose device configurations which include an insulation layer overlying the substrate with an additional conductive coating overlying the insulation layer and serving as the base electrode for the ceramic stack. These include U.S. Pat. No. 3,103,607 to Rulon and U.S. Pat. No. 3,127,534 to Diemer as well as Emmett '580 and Winsor '192. This insulation layer and "buried" electrode can serve to prevent diffusion from the substrate while providing a convenient means to electrically drive the device such that the outermost top electrode can be held at ground potential. This has the advantage that breaks in the outer protective cover would not expose high potential electrode areas creating a potential shock hazard. However, this configuration has a significant cost penalty created by the requirement for an additional conductive layer. In addition, none of the prior art considers the electrochemical consequences of leakage currents flowing through ceramic top layers overlying and protecting the top electrode. This invention recognizes the importance of inhibiting such leakage currents and implements a strategy to insulate the entire electroceramescent device (especially including the rear surface of the substrate) in such a way that the top electrode can be held at earth ground potential while the substrate serves as the high potential electrode.

Manufacturing cost considerations are a major factor in assuring a competitive ceramic EL device. For many important application areas (e.g. commercial signage), a level of customization is required which limits the amount of special tooling that is practical. As a specific example, much of the prior art uses screen printing techniques for one or more layers which do not easily accommodate low quantities of customized designs nor large device areas. However, screen printing enables a level of control which is important in assuring layer uniformity, bubble structure, etc. The manufacturing methodology taught by Emmett makes extensive use of liquid spray technology. This technology is fully compatible with relatively low cost, continuous flow processing methods. However, the evaporation of the carriers in the liquid spray slurries and the melding of the glass frits into a ceramic solid introduce a bubble structure which can have major adverse consequences. Bubbles formed in one layer can migrate to another during the firing of a subsequent layers. The bubbles tend to grow in size as they migrate upward through the ceramic stack and can result in significant electrical and optical degradation, especially if they reach the phosphor layer. This was a major problem in attempts to commercialize the Emmett design. Unlike prior art, this invention includes a combination of liquid spray and electrostatic spray options which support application to large areas in a continuous manufacturing flow while assuring controlled bubble structure and layer uniformity.

SUMMARY OF THE INVENTION

The primary objective of this invention is the realization of a light-emitting ceramic device (hereafter termed an "electroceramescent" device) exhibiting dramatically improved conversion efficiency (>3:1) and environmental durability relative to the ceramic EL prior art. A second major objective is the use of fabrication methodologies applicable to large areas (multiple sq. feet) and compatible with relatively low cost continuous flow processing. A third major objective is a fault tolerant device configuration which substantially enhances manufacturing yields.

A further objective of the present invention is to set forth a method of producing an electroceramescent device that is effective and predictable and overcomes the limitations of the prior art set forth above.

As discussed above, the method and device of the present invention overcomes the disadvantages inherent in prior art methods and devices. In this respect, before explaining at least one embodiment of the invention in detail, it is to be understood that the invention is not limited in its application to the details of construction and to the arrangement of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

Accordingly, those skilled in the art will appreciate that the conception upon which this invention is based may readily be utilized as a basis for the design of other structures, methods, and systems for carrying out the several purposes of the present invention. It is important, therefore, that the claims be regarded as including such equivalent constructions insofar as they do not depart from the spirit of the present invention.

Furthermore, the purpose of the foregoing Abstract is to enable the U.S. Patent and Trademark Office and the public generally, and especially including the practitioners in the art who are not familiar with patent or legal terms or phraseology, to determine quickly from a cursory inspection, the nature and essence of the technical disclosure of the application. The Abstract is neither intended to define the invention of the application, nor is it intended to be limiting to the scope of the invention in any way.

DETAILED DESCRIPTION OF THE INVENTION

Figure 1:
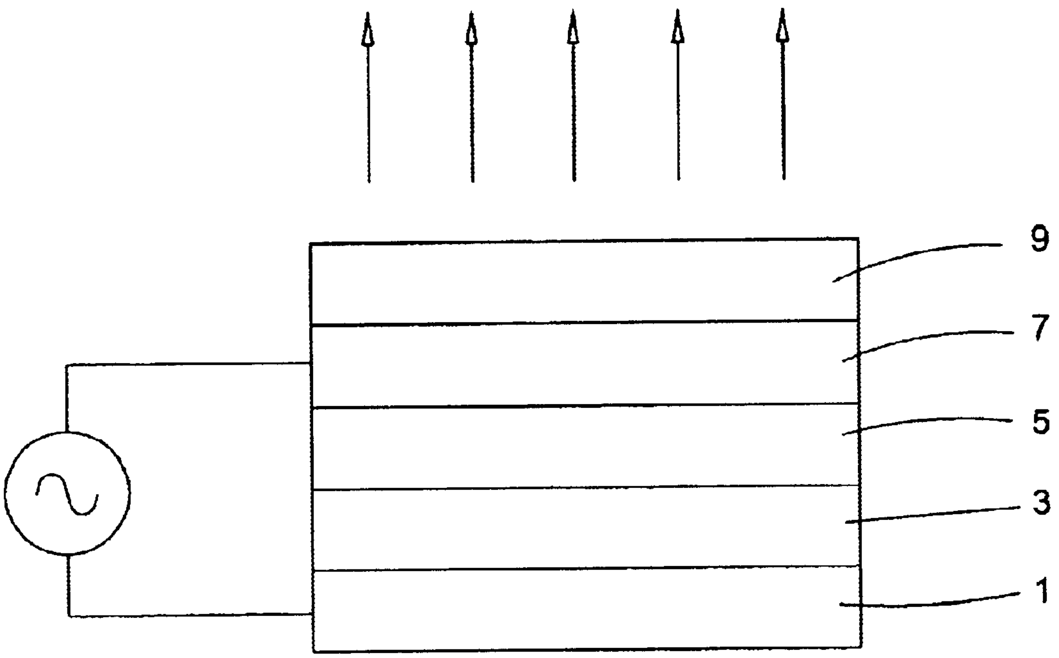
FIG. 1 (PRIOR ART)
FIG. 1 is a typical embodiment of a prior art electroluminescent device, showing the general construction layout.
Figure 2:
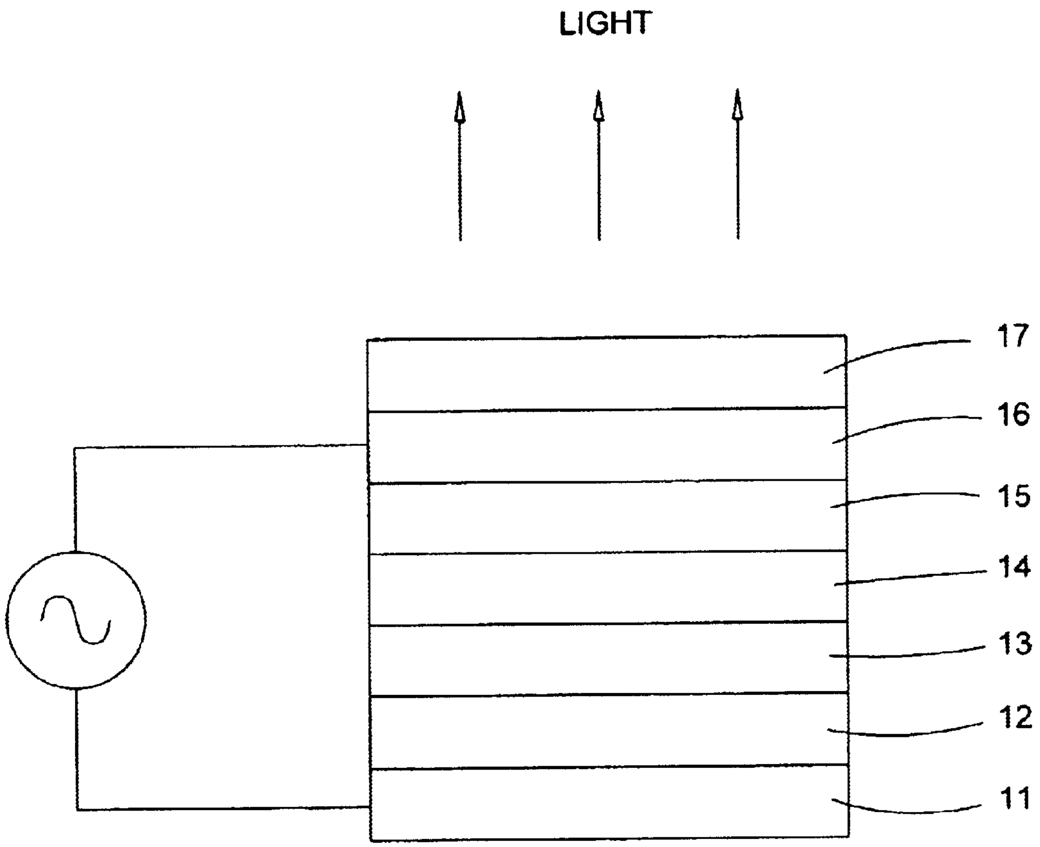
FIG. 2 (PRIOR ART)
FIG. 2 is another typical embodiment of a prior art electroluminescent device, showing the general layout construction.
Figure 3:
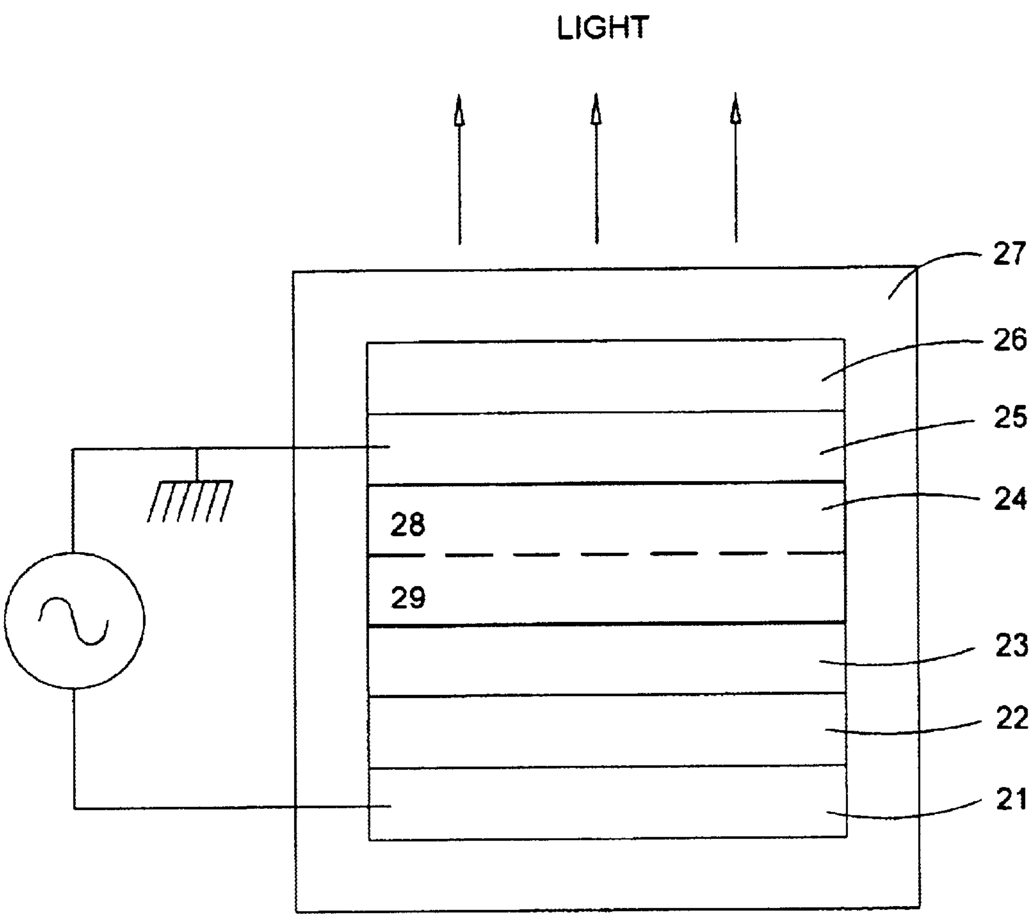
FIG. 3 is a cross sectional view of the preferred embodiment of an electroceramescent device according to the present invention.

A preferred embodiment of the present invention is illustrated in FIG. 3. The structural substrate 21, which also serves as the base electrode, is formed from 430 stainless steel. An oxide layer 22, comprised of chromium oxide and iron oxide, is formed on the steel substrate as a separate process step to assure bonding with the overlying semiconducting layer 23 while moderating diffusion of chromium and iron from the substrate 21. The semiconducting layer 23 is a borosilicate glass having a significant doped titanium oxide component providing low loss electrical connectivity between the base electrode and the light-emitting region. The conductivity of the material in this layer is controlled to provide current limiting in the event of localized electrical breakdowns in overlying layers.

The light-emitting region 24 is an integrated ceramic system composed of two (2) stacked structures defined as follows:

1) An insulation layer 28 comprised of densely packed barium titanate particles encased in a borosilicate glass matrix which: limits diffusion from the underlying semiconducting ceramic coating, provides a reflective interface with the phosphor layer, provides primary break-down protection for the device, and exhibits a dielectric constant substantially higher than the overlying phosphor layer, and 2) An electroluminescent phosphor layer 29, serving as the device light source, composed of doped zinc sulfide particles formed as a near mono-layer and uniformly encased in a borosilicate glass matrix.

A transparent top electrode 25, termed a "fuse coat", overlies the light-emitting region. This electrode is a thin, doped tin oxide coating applied to the top surface of the phosphor layer using a spray pyrolysis process. This conductive, transparent coating (in conjunction with the current limiting semiconducting layer) functions as a distributed fuse network which isolates and "heals" localized electrical break-downs. The surface of the phosphor layer is specifically textured to create the appropriate roughness necessary to assure electrical continuity of the thin electrode coating is spite of the stresses associated with formation of an overlying protective, top ceramic layer 26.

This topmost, transparent ceramic layer 26 is comprised of a low melting point borosilicate glass and serves to further protect the phosphor layer 28 from moisture contamination while completing the encasement of the top electrode 25 in non-combustible glass. In contrast to organic coatings which carbonize in the event of a local electrical breakdown leaving a substantial, visible damaged area, the glass overcoat of the present invention serves to quench the breakdown and "heal" the device without significant residual damage.

Lastly, the entire device is overcoated with a transparent polyurathene layer 27 to prevent moisture intrusion into the top ceramic layer 26 and to inhibit electrical leakage currents from the underlying top electrode 25 to the ambient environment which pass through this relatively vulnerable layer. Such leakage currents can result in severe electrochemical degradation of fused borosilicate glass structures.

Detailed Materials and Process Description

With continued reference to FIG. 3, a 430 alloy of stainless steel is used as the substrate material 21 for multiple reasons including: 1) excellent workability and strength as a structural support, 2) good electrical conductivity meeting all base electrode requirements including solderability, 3) excellent match of thermal expansion coefficient with the borosilicate glass family, 4) good corrosion resistance, 5) tolerance of the temperature extremes required for ceramic processing without surface deterioration (e.g. flaking), 6) facilitates controlled surface oxidation to provide good mechanical adhesion with the overlying borosilicate ceramic layer, and 7) provides a controlled diffusion source of chromium and iron doping agents to foster semiconducting behavior in the overlying ceramic layer 23.

The stainless steel is sandblasted to enhance chemical reactivity and improve mechanical adherence with the overlying ceramics. This roughened surface is pre-oxidized by high temperature exposure in an ambient air environment.

Preferably using an electrostatic spray methodology, a borosilicate glass layer having a significant titania component is formed on the oxidized steel substrate. This glass also includes a niobium component which, when combined with chromium and iron which diffuses from the substrate, creates a semiconducting layer with a bulk resistivity of approximately 10^4 ohm-cm. This resistivity level provides current limiting which acts in combination with the "fuse coat" top electrode 25 to provide protection against localized electrical breakdowns in overlying layers. The glass formulation used in this layer has a higher transition temperature than any of the other overlying ceramics thereby limiting upward diffusion in the ceramic stack of either metal ions or bubbles during subsequent firing cycles. In addition, the bubble structure is controlled by the frit size distribution and also through the selection of an optimal spray application method (electrostatic deposition preferred).

A further enhancement in break-down protection can be provided through an additional, thin, patterned layer of insulating borosilicate glass between the semiconducting layer 23 and the light-emitting region 24. The pattern of this additional layer (not illustrated in FIG. 3) is aligned with a projection of the distribution bus structure typically used in the top electrode. Such a bus structure has a high current carrying capacity which bypasses fuse coating protection. The subject patterned insulation layer provides protection against localized break-downs beneath this bus structure.

The critical light-emitting region 24 overlies the semiconducting layer. This region is carefully engineered as a multilayer ceramic stack to provide five (5) specific features:

1) isolation of the phosphor layer 28 from the semiconducting layer 23 using an insulation layer 29 to inhibit diffusion of metal ions and to provide primary device break-down protection.

2) control of porosity, surface uniformity, and reflectance of the insulation layer 29 in relation to the overlying phosphor layer 28 for enhanced light generation efficiency.

3) control of the dielectric properties of the insulation layer to minimize voltage drop and power dissipation while providing adequate mechanical strength.

4) formation of the phosphor layer 28 such that the doped zinc sulfide particles are deposited in a near mono-layer uniformly encased in a borosilicate glass matrix, and 5) control of the surface texture of the phosphor layer 28 in relation to the overlying top electrode 23.

The insulation layer 29 is comprised of high dielectric constant, high melting point (relative to the insulation layer fusing temperature), high reflectance material encased in a borosilicate glass matrix. The preferred composition is finely ground barium titanate encased in a minimal amount of insulating borosilicate glass. The transition temperature for this glass is held to substantially lower than the underlying semiconducting layer and similar to that of the phosphor layer 28. The dielectric constant of the insulation layer 29 is greater than that of the phosphor layer 28 by a ratio of at least 10:1. By minimizing the glass content of this layer, diffusion of metal ions from the semiconducting layer is inhibited, the dielectric constant is increased, and a good dissipation factor is assured.

Figure 4:
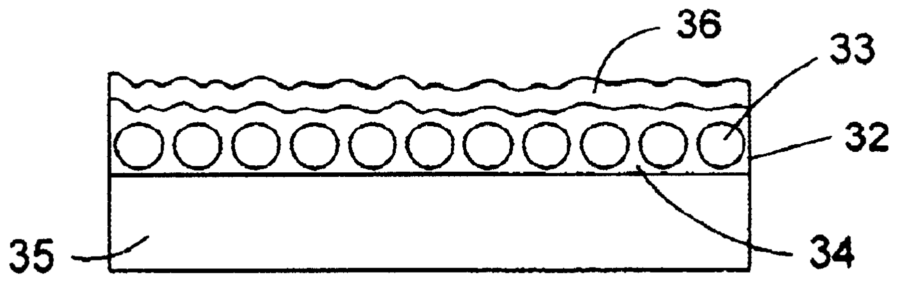
FIG. 4 is a cross sectional view of a light emitting region of an electroceramescent device showing the interaction of the top electrode and phosphor layer.

As illustrated in FIG. 4, the phosphor layer 32 is comprised of doped zinc sulfide particles 33 deposited in a near mono-layer and encased in borosilicate glass 34. It overlies the insulation layer 29. Preferably, the phosphor particles 33 are pre-coated with a thin glass layer and then deposited electrostatically in a sandwich fashion with additional borosilicate glass wherein the total glass volume is approximately equal to the phosphor volume. The surface of the layer assumes a knobby profile partially conforming to the underlying shape of the phosphor particles. A transparent tin oxide top electrode 36 is formed by spray pyrolysis as the phosphor layer emerges still molten from the furnace.

With continued reference to FIG. 4, the thin tin oxide layer 36 conforms to the textured surface of the phosphor layer 32. We have discovered that this configuration provides a far more durable tin oxide coating when stressed by the formation of the top ceramic layer (FIG. 3,). If the phosphor layer 32 is too smooth, the tin oxide coating 34 will fracture in this final firing cycle breaking the top electrode into discontinuous islands.

Figure 5:
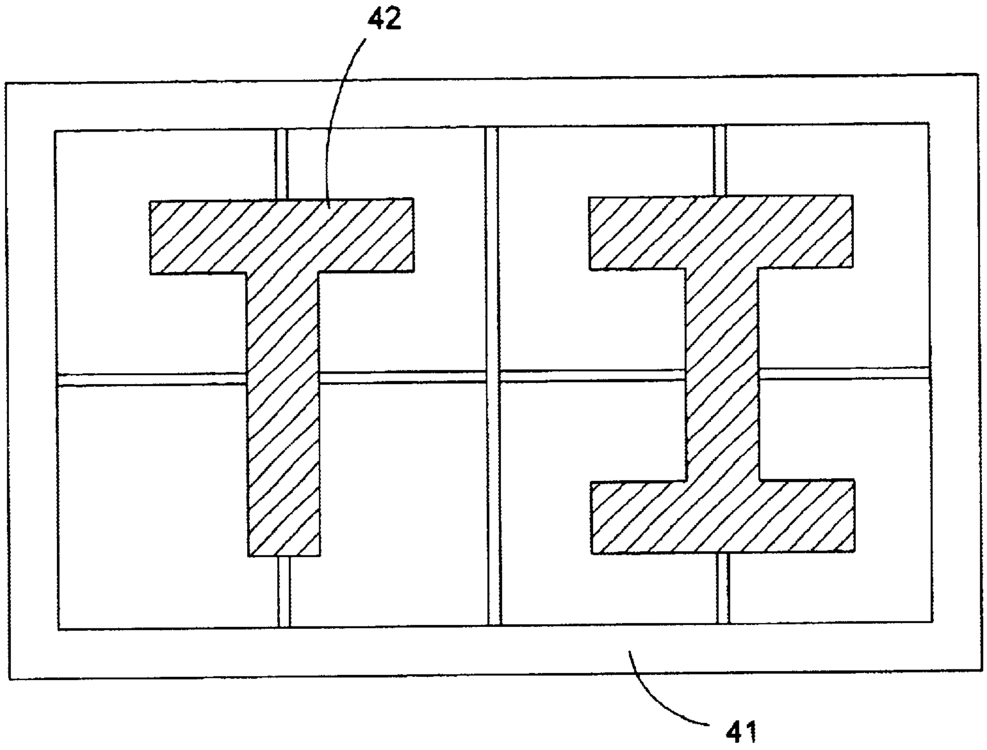
FIG. 5 is a plan view of a typical example of a patterned top electrode on an electroceramescent device.

A typical example layout of a top electrode is illustrated in FIG. 5. A distribution bus 41 is formed using a silver ink (which is subsequently dried and then fired with the topmost protective ceramic layer). To minimize device power consumption, the tin oxide coating 42 is scribed using an abrasion tool tracking a computer controlled outline of desired active areas. In this example, the regions are oversized versions of the information to be backlit (i.e., the letters "T" and "I") which are then masked to the final character outlines by overlays external to the electroceramescent device. Because the tin oxide "fuse coat" is very thin exhibiting a reduced conductivity, additional connections are made to the bus system as required to accommodate the desired active area geometry.

In the event of a localized break-down in the active area, the current limiting feature of the semiconducting layer provides time for the tin oxide "fuse coat" to open with minimal effect on device performance or appearance. The bus geometry is typically a square or rectangular matrix providing fuse coat display space for the various information characters or objects. As previously noted, a special insulation barrier can be added as a supplemental coating to the semiconductor layer providing enhanced break-down protection for regions under the high current capacity bus areas.

Returning to FIG. 3, the transparent top ceramic layer 26 is a low melting point borosilicate glass. Preferably, this layer is applied using electrostatic spray technology helping to assure a low bubble density. This layer completes the encasement of the top electrode in borosilicate glass which acts to quench any localized electrical breakdowns (and fuse coat response) without leaving a telltale mark. The selection of a low melting point glass permits a relatively low peak temperature in the firing profile, minimizing damage to the phosphor particles in the underlying light-emitting region. However, the glass constituents that lead to a low melting point also limit the durability of the fired layer.

Figure 6:
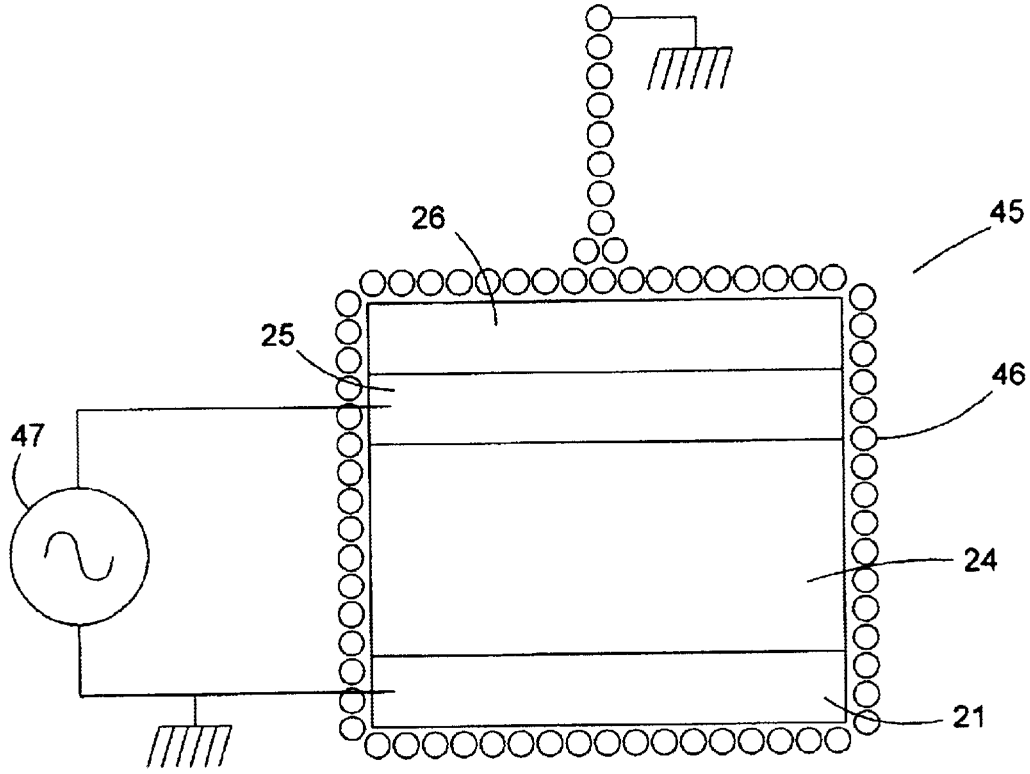
FIG. 6 is an illustration of an electroceramescent device operating in a high humidity environment and the leakage current path fostered by this high humidity.

Another consequence of the glass constituents needed for a low melting point is an enhanced bulk conductivity. An electroceramescent device 45 at this stage of fabrication is illustrated in FIG. 6 operating in a high humidity environment including, in the worst case, surface condensation 46 covering the entire outer surface of the device. In this example, the device is powered by 115 V, 60 Hz utility power supply 47 with the substrate electrode at ground potential and the top electrode running at 115 volts. Note that a leakage current path exists beginning at the top electrode, passing through the imperfect insulator represented by the top ceramic layer, and returning via the condensation layer to the substrate base electrode. Even if the base electrode were fully insulated, a similar leakage path (fostered by high humidity) would still exist to local support structure and returning to earth ground. Defects in the glass (pin holes, etc) can also provide points of reduced insulation resistance. Although these currents are small, the electrochemical effects (in the presence of moisture) integrated over months and years can destroy this outermost borosilicate glass layer.

Returning to FIG. 3, the preferred solution is a transparent, organic overcoat 27 acting as an insulator that protects the device from moisture intrusion and inhibits leakage currents from either electrode. The preferred organic coating material is a 2-part, UV stabilized, transparent polyurethane. As illustrated in FIG. 3, grounding the top electrode can further minimize any leakage to the surrounding environment. An isolation transformer, with or without an inverter system, can serve to isolate both device electrodes from any reference to earth ground. However, effective isolation of the substrate base electrode from the top ceramic layer is typically more critical. Given a well insulated base electrode, an electroceramescent device without the organic top coat can be protected using a sealed envelope of plastic material (e.g. a transparent polycarbonate).

We claim:

1. A method for fabricating a multilayered, light-emitting, ceramic device comprising:

a) formation of a substrate providing mechanical support for said multilayered device and having one or more conductive surfaces acting as base electrodes for overlying layers;

b) formation of one or more semiconductive ceramic layers overlying said base electrodes, wherein electrical conductivity and ionic diffusion in said semiconductive ceramic layers are controlled;

c) formation of light-emitting regions overlying said one or more semiconductive ceramic layers wherein said regions are an integrated composite of two (2) sequentially created layers consisting of:

(1) A ceramic insulation layer, and (2) An electroluminescent layer;

d) formation of one or more conductive top electrode layers overlying said light-emitting regions and having optically transmissive areas comprised of a transparent conductive coating of which operates as a fuse to isolate localized electrical breakdowns to minimize the effect of said breakdowns on overall device performance; and e) formation of a multilayered top barrier cover comprised of one or more optically transmissive, non-combustible, ceramic insulation layers overlying said top electrode regions.

2. The method of claim 1 wherein said substrate is formed into a planar shape.

3. The method of claim 1 wherein said substrate is formed into a planar shape with conductive base electrode surfaces on both sides supporting construction of a multilayered light-emitting system on both sides.

4. The method of claim 1 wherein said substrate is formed with an outer conductive electrode surface and an inner face having an overlying insulative coating.

5. The method of claim 1 wherein said substrate is a metallic solid.

6. The method of claim 5 wherein said substrate is stainless steel.

7. The method of claim 5 wherein said substrate base electrode areas are mechanically sandblasted, or otherwise roughened.

8. The method of claim 5 wherein said substrate is pre-oxidized by high temperature exposure in an oxidizing atmosphere before overlying layers are formed.

9. The method of claim 1 wherein said semiconducting ceramic layer is formed to extend beyond the substrate outer face and wrap around the substrate edges to partially, or completely, coat the inner substrate face.

10. The method of claim 1 wherein said semiconducting ceramic layer is deposited using electrostatic spray methods.

11. The method of claim 1 wherein said semiconductive ceramic layers contain chromium-oxide in a borosilicate glass overlying said corresponding base electrodes.

12. The method of claim 11 wherein said chromium-oxide component is formed through diffusion of chromium from a stainless steel substrate into a borosilicate glass containing titanium oxide.

13. The method of claim 11 wherein said borosilicate glass includes a niobium-oxide component.

14. The method of claim 1 wherein said semiconducting ceramic layer has a bulk resistivity in the range 10ˆ3 to 10ˆ5 ohm-cm.

15. The method of claim 1 wherein said ceramic insulation layer is formed by the method of:

a) utilizing a conventional liquid spray technology, a slurry is applied, said slurry comprised of:
  i) a liquid carrier,
  ii) at least one surfactant or stabilizer, and
  iii) a mixture of barium titanate and borosilicate glass powder;

b) drying of said layer to remove the liquid carrier; and c) firing or baking said layer into a ceramic.

16. The method of claim 15 wherein said barium titanate powder is pre-coated with a layer of borosilicate glass before incorporation into said spray slurry.

17. The method of claim 15 wherein said barium titanate powder is formed by:

a) sintering barium titanate with selected additives into a material exhibiting an enhanced dielectric constant, and b) regrinding and classifying said material into an appropriate size distribution for use in said insulation layer.

18. The method of claim 15 wherein the peak temperature of said firing profile of said ceramic is lower than the peak temperature of the firing profile used for the underlying semiconductive ceramic layer.

19. The method of claim 1 wherein said ceramic insulation layer is formed by the steps of:

a) utilizing electrostatic spray methods to deposit coated, barium titanate powder into a layer, and b) firing said layer into a ceramic.

20. The method of claim 19 wherein said coating of said barium titanate powder is comprised of two (2) layers consisting of:

a) a layer of borosilicate glass and b) a top coat of methyl hydrogen siloxane.

21. The method of claim 19 wherein said barium titanate powder is formed by the steps of:

a) sintering barium titanate with selected additives into a material exhibiting an enhanced dielectric constant, and b) regrinding and classifying said material into an appropriate size distribution for use in said insulation layer.

22. The method of claim 19 wherein the peak temperature of said firing profile of said ceramic is lower than the peak temperature of the firing profile used for the underlying semiconductive ceramic layer.

23. The method of claim 1 wherein said ceramic insulation layer is formed by the steps of:

a) utilizing electrostatic spray methods to deposit one or more layers of coated barium titanate powder with one or more layers of coated borosilicate glass powder, and b) co-firing said layers into a ceramic composition.

24. The method of claim 23 wherein said composite is formed by sequentially depositing:

a) a later of coated barium titanate powder, and b) an overlying layer of coated borosilicate glass powder.

25. The method of claim 23 wherein said composite is formed by sequentially depositing:

a) a layer of coated borosilicate glass, b) an intermediate layer of coated barium titanate powder, and c) and overlying layer of coated borosilicate glass powder.

26. The method of claim 23 wherein said coating on said barium titanate powder is comprised of:

a) a layer of borosilicate glass, and b) a top coat of methyl hydrogen siloxane.

27. The method of claim 23 wherein said barium titanate powder is formed by the steps of:

a) sintering barium titanate with selected additives into a material exhibiting an enhanced dielectric constant, and b) regrinding and classifying said material into an appropriate size distribution for use in said insulation layer.

28. The method of claim 23 wherein the peak temperature of said firing profile of said ceramic composite is lower than the peak temperature of the firing profile used for the underlying semiconductive ceramic layer.

29. The method of claim 23 wherein said coating on said borosilicate glass is methyl hydrogen siloxane.

30. The method of claim 1 wherein said electroluminescent layer is formed by the steps of:

a) applying a layer of liquid slurry by utilizing a liquid spray method, said slurry comprised of:
  1) a liquid carrier;
  2) at least one surfactant or stabilizer;
  3) doped zinc sulphide phosphors; and
  4) borosilicate glass powder;

b) drying said layer of liquid slurry to remove said liquid carrier, and c) firing said layer into a ceramic composite.

31. The method of claim 30 wherein said doped zinc sulfide phosphors are precoated with a layer of borosilicate glass before incorporation into said spray slurry.

32. The method of claim 30 wherein the peak temperature of said firing profile of said ceramic composite is equal to, or lower than, the peak temperature of the firing profile used for the underlying insulation layer.

33. The method of claim 1 wherein said electroluminescent layer is formed by the steps of:

a) using an electrostatic spray method to deposit one or more layers of coated, doped zinc sulfide phosphors with one or more layers of coated borosilicate glass and b) co-firing said interleaved layers into a ceramic composite.

34. The method of claim 33 wherein the deposit of said layers is performed by sequentially depositing:

a) a layer of coated, doped zinc sulfide phosphor(s) and b) an overlying layer of coated borosilicate glass powder.

35. The method of claim 33 is wherein said layers are comprised of:

a) a layer of borosilicate glass;

b) an intermediate layer of coated, doped zinc sulfide phosphors; and c) an overlying layer of coated borosilicate glass powder.

36. The method of claim 33 wherein said coating on said doped zinc sulfide phosphors is comprised of:

a) a layer of borosilicate glass and b) a top coat of methyl hydrogen siloxane.

37. The method of claim 33 wherein the peak temperature of said firing profile of said ceramic composite is lower than the peak temperature of the firing profile used for the underlying insulation layer.

38. The method of claim 33 wherein said coating on said borosilicate glass powder is methyl hydrogen siloxane.

39. The method of claim 1 wherein said top electrode layers include both optically transmissive and opaque areas which selectively provide electrical conductivity to said underlying light emitting regions.

40. The method of claim 39 wherein said top electrode layers are overlaid by, and electrically connected to, a power distribution network of conductive paths and contact areas having a current carrying capacity sufficient to cause a permanent device failure in the event of an electrical breakdown beneath said conductive paths and contact areas.

41. The method of claim 40 wherein said power distribution network is created through the application of silver particles suspended in a liquid or paste carrier which are fired into conductive paths that adhere to said underlying light-emitting regions while maintaining electrical contact with said top electrode layers.

42. The method of claim 40 wherein either said semiconductive ceramic layer underlying the light-emitting region or said ceramic insulation layer underlying said electroluminescent layer is overlaid with a patterned ceramic insulative coating geometrically aligned to overlap the area of said power distribution network as projected from the top electrode layer.

43. The method of claim 1 wherein said top electrode layers are a doped tin oxide coating applied to the top surface of the underlying light-emitting region using spray pyrolysis.

44. The method of claim 1 wherein said top electrode layers are patterned such that only selected areas of the underlying light-emitting region are electrically stimulated.

45. The method of claim 44 wherein said top electrode layers are patterned by abrasion with minimal removal of material beneath said top electrode layer.

46. The method of claim 1 wherein said first layer of said multilayered top barrier is low melting point, borosilicate glass.

47. The method of claim 46 wherein said borosilicate glass is patterned with coloring elements to form an information display.

48. The method of claim 1 wherein said multilayered, light emitting, ceramic device further features one or more optically transmissive, organic insulating layers overlying said one or more optically transmissive, non-combustible, ceramic insulation layers.

49. The method of claim 48 wherein said one or more organic insulating layers wraps around said substrate edges and partially or completely covers the adjacent rear substrate face.

50. The method of claim 48 wherein said outermost organic insulating layer is an ultraviolet stabilized, two-part polyurethane material with an adhesion promoter additive optimized for glass surfaces.

* * * * *